United States Patent [19]

Sugiyama

[11] Patent Number: 5,436,572
[45] Date of Patent: Jul. 25, 1995

[54] SEMICONDUCTOR INTEGRATED CIRCUUIT DEVICE OF DUAL CONFIGURATION HAVING ENHANCED SOFT ERROR WITHSTANDING CAPACITY

[75] Inventor: Eiji Sugiyama, Kawasaki, Japan

[73] Assignee: Fujitsu Limited, Kawasaki, Japan

[21] Appl. No.: 109,518

[22] Filed: Aug. 20, 1993

[30] Foreign Application Priority Data

Feb. 10, 1993 [JP] Japan .................................. 5-022780

[51] Int. Cl.$^6$ ........................................... H03K 19/003
[52] U.S. Cl. ...................................... 326/12; 326/125; 327/215
[58] Field of Search ............ 307/443, 441, 464, 272.2, 307/272.3; 365/154, 189.05, 206, 214

[56] References Cited

U.S. PATENT DOCUMENTS

| 3,900,741 | 8/1975 | Fletcher et al. | 307/441 |
| 3,917,961 | 11/1975 | Reed | 307/272.2 X |
| 4,154,395 | 5/1979 | Fancy | 307/441 X |
| 4,613,777 | 9/1986 | Kible | 307/272.2 X |
| 4,849,657 | 7/1989 | Boisvert | 307/441 |
| 5,175,605 | 12/1992 | Pavlu et al. | 307/441 X |
| 5,250,858 | 10/1993 | Strong | 307/443 X |

Primary Examiner—David R. Hudspeth
Attorney, Agent, or Firm—Staas & Halsey

[57] ABSTRACT

A semiconductor integrated circuit device has a dual configuration involving a first latch circuit and a second latch circuit that are connected in parallel with each other. The first latch circuit is provided with an input terminal to operate the first latch circuit independently of the second latch circuit. This semiconductor integrated circuit device is capable of individually testing the latch circuits of the dual configuration, to ensure the merit of the dual configuration.

7 Claims, 8 Drawing Sheets

SEMICONDUCTOR INTEGRATED CIRCUIT DEVICE OF DUAL CONFIGURATION HAVING ENHANCED SOFT ERROR WITHSTANDING CAPACITY

BACKGROUND OF THE INVENTION

1. Field of the Invention

The present invention relates to a seminconductor IC (integrated circuit) device and, more particularly, to a semiconductor IC device of dual configuration having an enhanced soft error withstanding capacity.

2. Description of the Related Art

The size of information processing systems is continuously increasing as the amount of information to process is expanding. The larger the size of the information processing systems, the worse the influence thereof on a community that is employing the systems, once the systems fail. The most important problem of the systems is to improve and maintain reliability. The reliability of the systems depends on the quality of both the software and the hardware used therein. One of the techniques to improve the quality of hardware of these systems is to implement same in a dual configuration, thereby to enhance the soft error withstanding capacity of latch circuits employed therein against alpha rays. It is necessary to provide various semiconductor IC devices of dual configuration, to meet a variety of user requirements.

SUMMARY OF THE INVENTION

An object of the present invention is to individually test circuits that form a dual configuration, to secure the merit of the dual configuration.

Another object of the present invention is to selectively provide a dual configuration at a necessary part in an IC device, to suppress an increase in the number of gates of the device and ensure the effect of the dual configuration.

Still another object of the present invention is to supply reference voltages from different generators to circuits that form a dual configuration, to further ensure the effect of the dual configuration.

According to the present invention there is provided a semiconductor integrated circuit device comprising a dual configuration involving a first latch circuit and a second latch circuit connected in parallel with each other, and an input terminal provided for the first latch circuit, to operate the first latch circuit independently of the second latch circuit.

The input terminal to operate the first latch circuit independently of the second latch circuit may receive a data signal. The input terminals to operate the first latch circuit independently of the second latch circuit may receive a sample signal and a hold signal.

The first and second latch circuits may form a dual latch configuration, and the second latch circuit may be provided with an input terminal to operate the second latch circuit independently of the first latch circuit. The input terminal to operate the second latch circuit independently of the first latch circuit may receive a data signal. The input terminals to operate the second latch circuit independently of the first latch circuit may receive a sample signal and a hold signal.

According to the present invention there is also provided a semiconductor integrated circuit device comprising a dual configuration involving a first latch circuit and a second latch circuit connected in parallel with each other, and an output terminal provided for the first latch circuit, to provide an output of the first latch circuit independently of an output of the second latch circuit.

The first and second latch circuits may form a dual latch configuration, and the second latch circuit may be provided with an output terminal to provide an output of the second latch circuit independently of an output of the first latch circuit.

Further, according to the present invention there is provided a semiconductor integrated circuit device comprising a dual configuration involving a first latch circuit and a second latch circuit connected in parallel with each other, and a macro cell involving reference voltage generators to provide reference voltages to the first and second latch circuits, respectively.

The first and second latch circuits may form a dual latch configuration, and two different reference voltage generators may be provided for the dual latch configuration. The first and second latch circuits may form a dual latch configuration, and four different reference voltage generators may be provided for the dual latch configuration.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, the problems of the prior art will first be explained.

FIGS. 1A to 1D are logic circuit diagrams showing latch circuits of semiconductor IC devices. These latch circuits employ different, respective ECL gates.

Figure 1A:
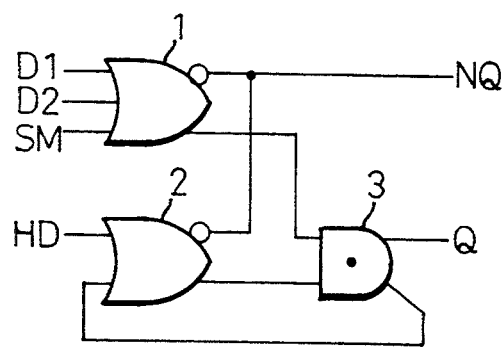
FIGS. 1A to 1D are logic circuit diagrams showing latch circuits of semiconductor IC devices according to the prior art.

The latch circuit of FIG. 1A has three logic gates, i.e., OR/NOR gates 1 and 2 and an AND gate 3. The latch circuit of FIG. 1B has three logic gates, i.e., OR/NOR gates 4 and 5 and an AND gate 6. The latch circuit of FIG. 1C has two logic gates, i.e., OR/NOR gates 7 and 8. The latch circuit of FIG. 1D has two logic gates, i.e., OR/NOR gates 9 and 10. Reference marks (i.e., legends) D1 and D2 are data signals, SM is a sample signal, HD is a hold signal, Q is an output signal, NQ is an inverted signal of the output signal Q, and /D is a data signal of an inverted level.

In FIG. 1A, the latch circuit comprises the OR/NOR gates 1 and 2 and AND gate 3. The OR/NOR gate 1 has input terminals to receive data signals D1 and D2 and a sample signal SM. The OR/NOR gate 1 supplies an OR output to an input terminal of the AND gate 3. The OR/NOR gate 2 has input terminals to receive a hold signal HD and an output of the AND gate 3. The OR/NOR gate 2 supplies an OR output to another input terminal of the AND gate 3. A NOR output (E-dot output) of the OR/NOR gate 1 and a NOR output of the OR/NOR gate 2 form an inverted output NQ of the latch circuit. An output of the AND gate 3 forms an output Q of the latch circuit.

Figure 1B:
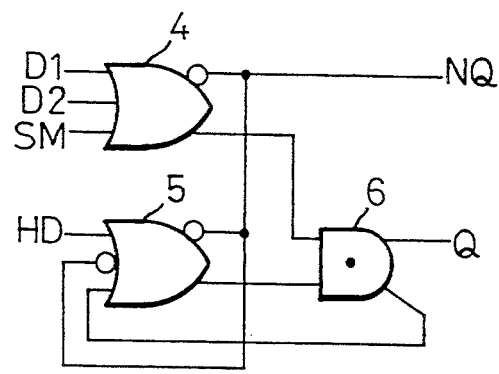

In FIG. 1B, the latch circuit comprises the OR/NOR gates 4 and 5 and AND gate 6. The OR/NOR gate 4 has input terminals to receive data signals D1 and D2 and a sample signal SM. The gate 4 supplies an OR output to an input terminal of the AND gate 6. The OR/NOR gate 5 has input terminals to receive a hold signal HD and an output of the AND gate 3. The OR/NOR gate 5 supplies an OR output to another input terminal of the AND gate 6. A NOR output of the OR/NOR gate 4 and a NOR output of the OR/NOR gate 5 form an inverted output NQ of the latch circuit. An output of the AND gate 6 forms an output Q of the latch circuit.

Figure 1C:
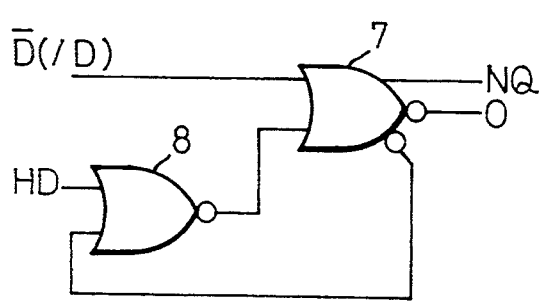

In FIG. 1C, the latch circuit comprises the OR/NOR gate 7 and NOR gate 8. The OR/NOR gate 7 has input terminals to receive a data signal /D of inverted level and an output of the NOR gate 8. The OR/NOR gate 7 provides an OR output as an inverted output NQ of the latch circuit, as well as a NOR output as an output Q of the latch circuit. The NOR gate 8 has input terminals to receive a hold signal HD and the NOR output of the OR/NOR gate 7.

Figure 1D:
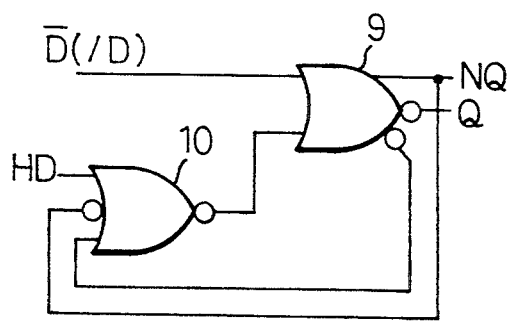

In FIG. 1D, the latch circuit comprises the OR/NOR gate 9 and NOR gate 10. The OR/NOR gate 9 has input terminals to receive a data signal/D of inverted level and an output of the NOR gate 10. The gate 9 provides an OR output as an inverted output NQ of the latch circuit, which is also supplied to an inverting input terminal of the NOR gate 10. The OR/NOR gate 9 also provides a NOR output as an output Q of the latch circuit. The NOR gate 10 has input terminals to receive a hold signal HD and the NOR output of the OR/NOR gate 9.

Figure 2:
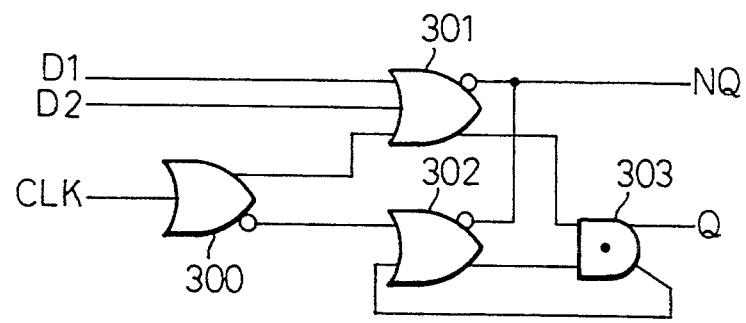
FIG. 2 shows a circuit employing the latch circuit of FIG. 1A.

FIG. 2 shows a circuit employing the latch circuit of FIG. 1A plus an OR/NOR gate 300 to receive a clock signal CLK. Namely, OR/NOR gates 301 and 302 and an AND gate 303 of FIG. 2 correspond to the OR/NOR gates 1 and 2 and AND gate 3 of FIG. 1A.

Figure 3:
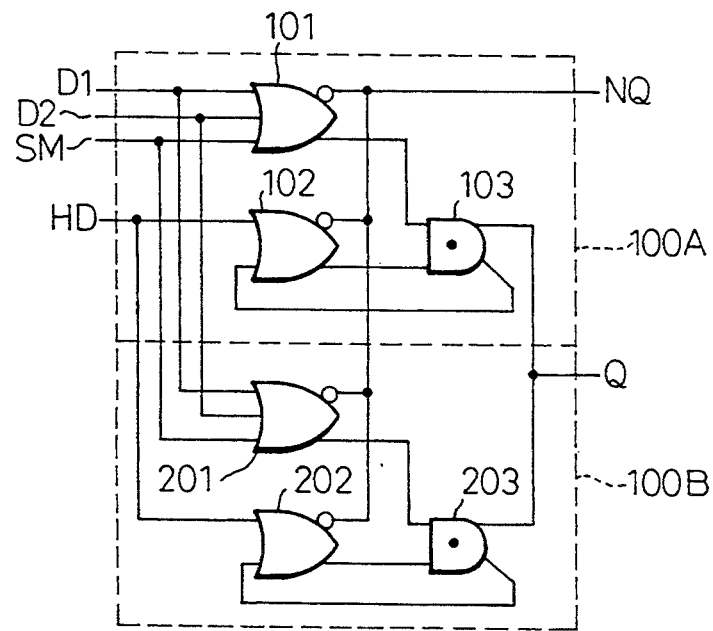
FIG. 3 is a logic circuit diagram showing a prior art semiconductor IC device.

FIG. 3 is a logic circuit diagram of a prior art semiconductor IC device. This device employs a dual latch configuration and is formed of two latch circuits 100A and 100B connected in parallel with each other. Each of the latch circuits 100A and 100B is the same as the one shown in FIG. 1A. Namely, OR/NOR gates 101 and 102 and an AND gate 103 of the first latch circuit 100A, and OR/NOR gates 201 and 202 and an AND gate 203 of the second latch circuit 100B correspond to the OR/NOR gates 1 and 2 and AND gate 3 of FIG. 1A, respectively.

Figure 4:
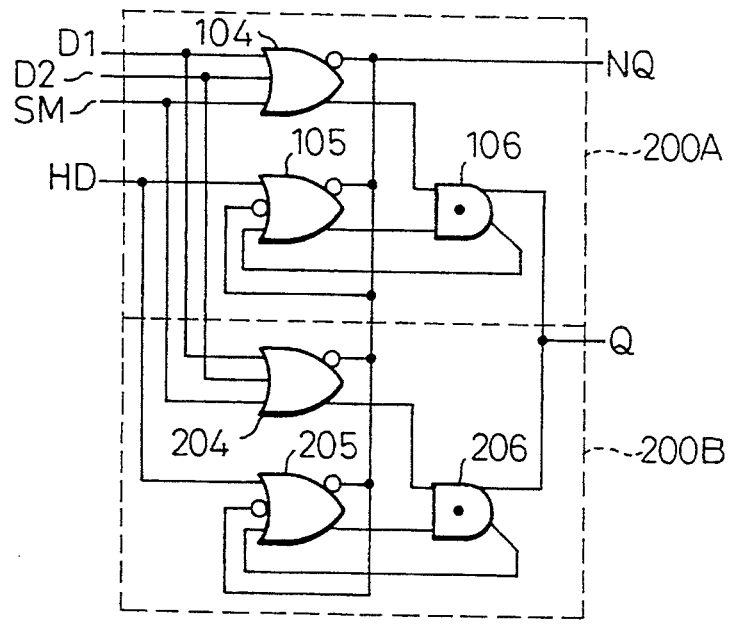
FIG. 4 is a logic circuit diagram showing a prior art semiconductor IC device.

FIG. 4 is a logic circuit diagram of another semiconductor IC device. This device employs a dual latch configuration and is formed of two latch circuits 200A and 200B connected in parallel with each other. OR/NOR gates 104 and 105 and an AND gate 106 of the first latch circuit 200A, and OR/NOR gates 204 and 205 and an AND gate 206 of the second latch circuit 200B correspond to the OR/NOR gates 4 and 5 and AND gate 6 of FIG. 1B, respectively.

Figure 5:
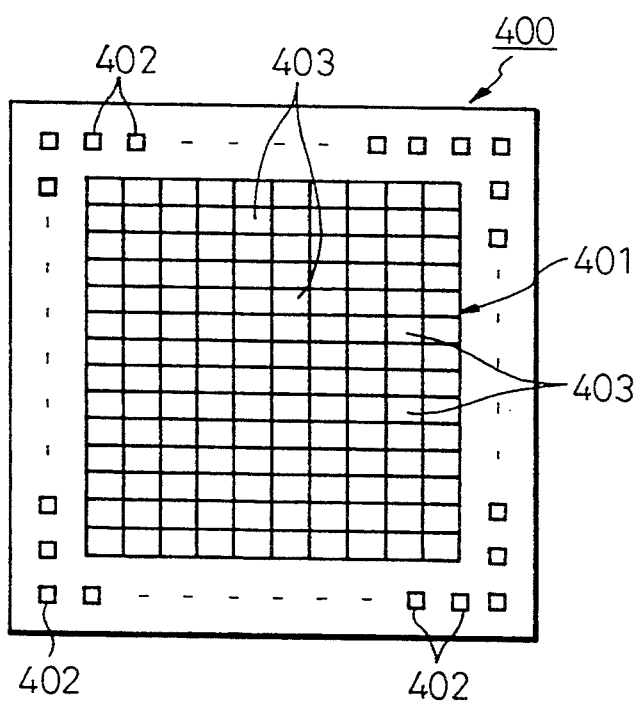
FIG. 5 shows a gate array of a semiconductor IC device.

FIG. 5 schematically shows a gate array of a semiconductor IC device. Numeral 400 is a semiconductor chip, 401 is the gate array, 402 designates I/O terminals of the semiconductor chip, and 403 designates each of plural cells in the gate array.

Figure 6:
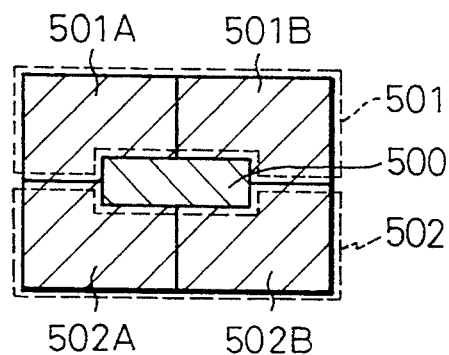
FIG. 6 shows a macro cell employed for a semiconductor IC device according to a prior art.

FIG. 6 shows a conventional macro cell to be disposed in the gate array 401 of the semiconductor IC device of FIG. 5. Numeral 500 is a reference voltage generator and 501A, 501B, 502A, and 502B are basic circuits each corresponding to the basic cell 403. The basic circuits 501A and 501B form a first latch circuit 501, and the basic circuits 502A and 502B form a second latch circuit 502. The latch circuits 501 and 502 form a dual latch configuration.

In FIG. 6, the two latch circuits 501 and 502 of conventional dual configuration are provided with the single reference voltage generator 500. Namely, the same output of the generator 500 is supplied to both the latch circuits 501 and 502 of the dual configuration.

The dual configuration is provided to avoid soft latch errors due to alpha rays. Namely, it prevents an inversion of logic levels even if alpha rays hit one of the two latch circuits of the dual configuration.

According to the conventional dual latch configurations of FIGS. 3 and 4, input signals such as the data input signals D1 and D2, sample signal SM, and hold signal HD are commonly supplied to each of the dual latch circuits 100A and 100B (FIG. 3) and each of the dual latch circuits 200A and 200B (FIG. 4). Similarly, the output signal Q and inverted output signal NQ are commonly supplied from the respective Q and NQ outputs of the latch circuits 100A and 100B (FIG. 3) and from the latch circuits 200A and 200B (FIG. 4).

If one of the latch circuits 100A and 100B, or one of the latch circuits 200A and 200B fails, the failure will not be detected due to the redundancy of the conventional dual configurations. Namely, none of the conventional dual configurations is a true dual configuration, and thus none thereof can provide an expected (i.e., intended) dual effect.

Generally, the number of gates to be formed on an LSI is limited. If most of the gates are used for logic operations, there will be no space to add gates to form dual configurations to prevent soft errors due to alpha rays.

As explained with reference to FIG. 6, some ECL gates need a reference voltage. If two latch circuits that form a dual configuration receive a reference voltage from a single generator and if alpha rays hit the generator, a soft error will occur and thereby spoil the effect of the dual configuration.

Next, preferred embodiments of the present invention will be explained with reference to the drawings.

Figure 7:
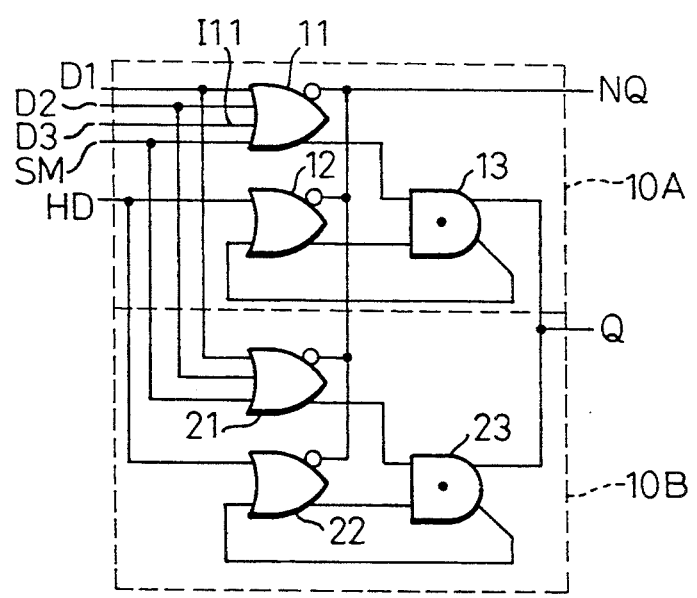
FIG. 7 is a logic circuit diagram of a semiconductor IC device according to a first embodiment of the present invention.

FIG. 7 is a logic circuit diagram showing of a semiconductor IC device having a dual latch configuration according to a first embodiment of the present invention. This embodiment is characterized by a gate having an independent input terminal.

The embodiment of FIG. 7 is based on the prior art of FIG. 3. In FIG. 7, an OR/NOR gate 11 of a first latch circuit 10A is additionally provided with an input terminal I11 to receive a data signal D3. Reference marks D1, D2, and D3 are data signals, SM is a sample signal, HD is a hold signal, Q is an output signal, and NQ is an inverted signal of the output signal Q.

The dual latch configuration of FIG. 7 is formed of the first latch circuit 10A and a second latch circuit 10B. The first latch circuit 10A has OR/NOR gates 11 and 12 and an AND gate 13. The OR/NOR gate 11 has corresponding input terminals which receive the data signals D1, D2, and D3 and sample signal SM. The OR/NOR gate 11 supplies an OR output to a first input terminal of the AND gate 13. The OR/NOR gate 12 has corresponding input terminals which receive the hold signal HD and an output of the AND gate 13. The OR/NOR gate 12 supplies an OR output to a second input terminal of the AND gate 13.

The second latch circuit 10B has OR/NOR gates 21 and 22 and an AND gate 23. The OR/NOR gate 21 has corresponding input terminals which receive the data signals D1 and D2 and sample signal SM. The OR/NOR gate 21 supplies an OR output to a first input terminal of the AND gate 23. The OR/NOR gate 22 has corresponding input terminals which receive the hold signal HD and an output of the AND gate 23. The OR/NOR gate 22 supplies an OR output to a second input terminal of the AND gate 23.

A NOR output (E-dot output) of the OR/NOR gate 11, a NOR output of the OR/NOR gate 12, a NOR output of the OR/NOR gate 21, and a NOR output of the OR/NOR gate 22 form the inverted output NQ of the dual latch configuration. An output of the AND gate 13 and an output of the AND gate 23 are connected and form the output Q of the dual latch configuration device of FIG. 7.

According to the dual latch configuration device of the first embodiment of FIG. 7, the data signals D1 and D2 are each set to, for example, a LOW level and are supplied respectively to the first and second latch circuits 10A and 10B. At the same time, the data signal D3 supplied only to the first latch circuit 10A is changed to test the operation of the first latch circuit 10A. When the data signal D3 is kept at LOW level, the dual circuit of FIG. 7 operates in the same manner as that of FIG. 3.

In this way, this embodiment is capable of discretely testing the latch circuit 10A of the dual latch configuration, to ensure the merit of the dual configuration.

Figure 8:
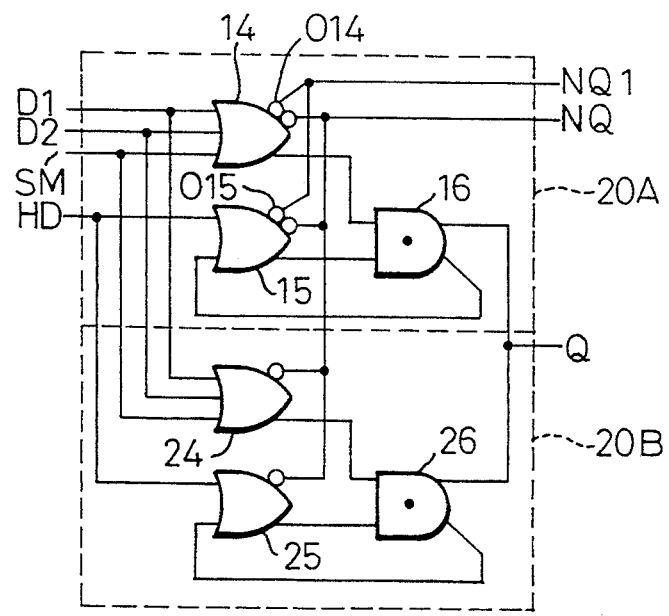
FIG. 8 is a logic circuit diagram a a semiconductor IC device according to a second embodiment of the present invention.

FIG. 8 is a logic circuit diagram showing a semiconductor IC device having a dual latch Configuration of a semiconductor IC device according to a second embodiment of the present invention. This embodiment is characterized by a gate having an independent output terminal.

The embodiment of FIG. 8 is based on the prior art of FIG. 3. In FIG. 8, OR/NOR gates 14 and 15 of a first latch circuit 20A additionally have output terminals O14 and O15, respectively, to provide an output signal NQ1 of inverted level. The other parts of this embodiment, such as an AND gate 16 of the first latch circuit 20A and OR/NOR gates 24 and 25 and an AND gate 26 of a second latch circuit 20B, are the same as the AND gate 103 of the first latch circuit 100A and the OR/NOR gates 201 and 202 and AND gate 203 of the second latch circuit 100B of the conventional dual latch configuration of FIG. 3.

According to the dual latch configuration of the second embodiment of FIG. 8, the output signal NQ1 of inverted level of the first latch circuit 20A is detected alone to check the operation of the first latch circuit 20A.

In this way, the second embodiment is capable of discretely testing the operation of the first latch circuit 20A of the dual latch configuration, to assure the intended effect of the dual configuration.

Figure 9:
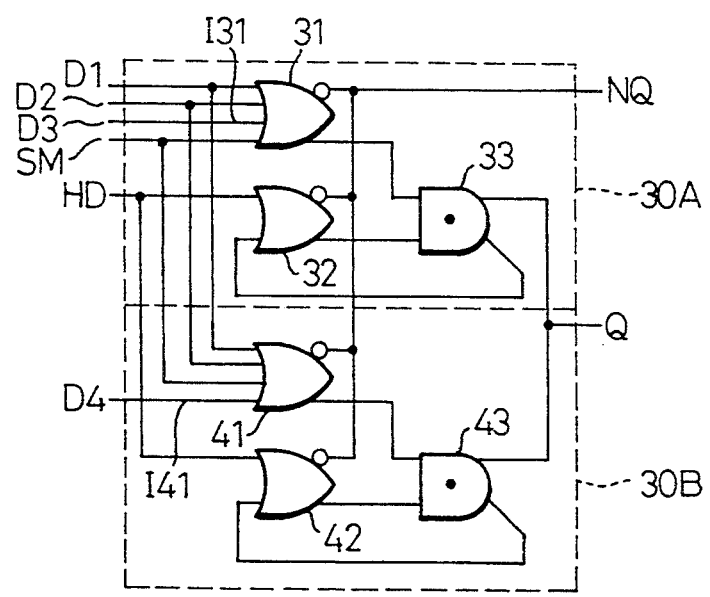
FIG. 9 is a logic circuit diagram a a semiconductor IC device according to a third embodiment of the present invention.

FIG. 9 is a logic circuit diagram of a semiconductor IC device having a dual latch configuration according to a third embodiment of the present invention. This embodiment is characterized in that each latch circuit has a gate having an independent input terminal.

The embodiment of FIG. 9 differs from the first embodiment of FIG. 7 in that an OR/NOR gate 41 of a second latch circuit 30B of FIG. 9 has an input terminal I41 to receive a data signal D4. The other parts of the third embodiment are the same as those of the first embodiment of FIG. 7. Namely, OR/NOR gates 31 and 32 and an AND gate 33 of a first latch circuit 30A and an OR/NOR gate 42 and an AND gate 43 of the second latch circuit 30B of the third embodiment are the same as the OR/NOR gates 11 and 12 and AND gate 13 of the first latch circuit 10A and the OR/NOR gate 22 and AND gate 23 of the second latch circuit 10B of the first embodiment of FIG. 7.

According to the dual latch configuration of the third embodiment of FIG. 9, the data signals D1 and D2 are each set to, for example, a LOW level and are supplied respectively to the first and second latch circuits 30A and 30B. At the same time, the data signal D3, supplied only to the first latch circuit 30A, is changed to check the operation of the first latch circuit 30A. Alternatively, the data signal D4, supplied only to the second latch circuit 30B, is changed to check the operation of the second latch circuit 30B.

In this way, this embodiment is capable of separately testing the first and second latch circuits 30A and 30B of the dual latch configuration according to the data signals D3 and D4, to assure the intended merit of the dual configuration is achieved.

Figure 10:
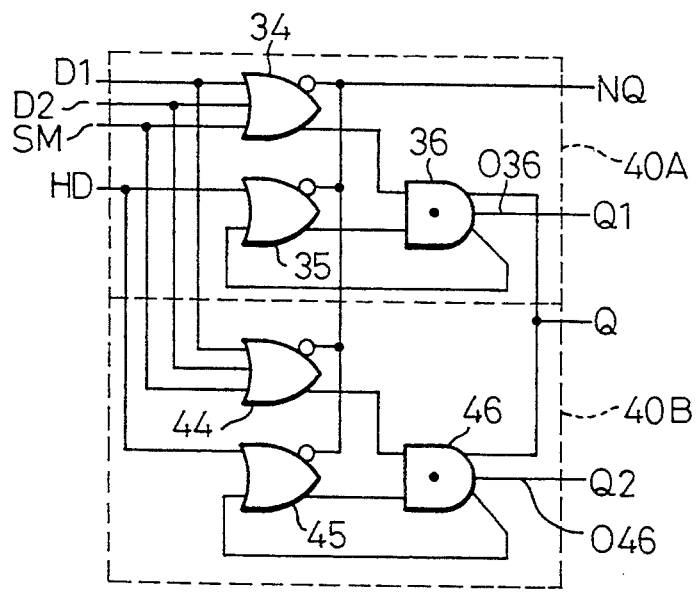
FIG. 10 is a logic circuit diagram a a semiconductor IC device according to a fourth embodiment of the present invention.

FIG. 10 is a logic circuit diagram of a semiconductor IC device having a dual latch configuration according to a fourth embodiment of the present invention. This embodiment is characterized in that each latch circuit has a gate having an independent output terminal.

The embodiment of FIG. 10 resembles the prior art of FIG. 3 but differs therefrom in that an AND gate 36 of a first latch circuit 40A additionally has an output terminal O36 to provide an output signal Q1, and an AND gate 46 of a second latch circuit 40B additionally has an output terminal O46 to provide an output signal Q2. The other parts of the fourth embodiment are the same as those of the prior art of FIG. 3. Namely, OR/NOR gates 34 and 35 of the first latch circuit 40A and OR/NOR gates 44 and 45 of the second latch circuit 40B of the fourth embodiment are the same as the OR/NOR gates 101 and 102 of the first latch circuit 100A and the OR/NOR gates 201 and 202 of the second latch circuit 100B of the prior art of FIG. 3.

According to the dual latch configuration of the fourth embodiment of FIG. 10, the output Q1 of the AND gate 36 and the output Q2 of the AND gate 46 are separately detectable, thereby to separately test the operations of the first and second latch circuits 40A and 40B of the dual latch configuration. This results in further progress toward assuring the intended effect of the dual configuration is achieved.

As explained above, the first to fourth embodiments of FIGS. 7 to 10 employ latch gates having respective testing I/O terminals (input or output terminals), to separately test first and second latch circuits that form a dual latch configuration, thereby securing the merit of the dual configuration. The arrangements of the first and second latch circuits are not limited to those shown in FIGS. 7 to 10.

Figure 11:
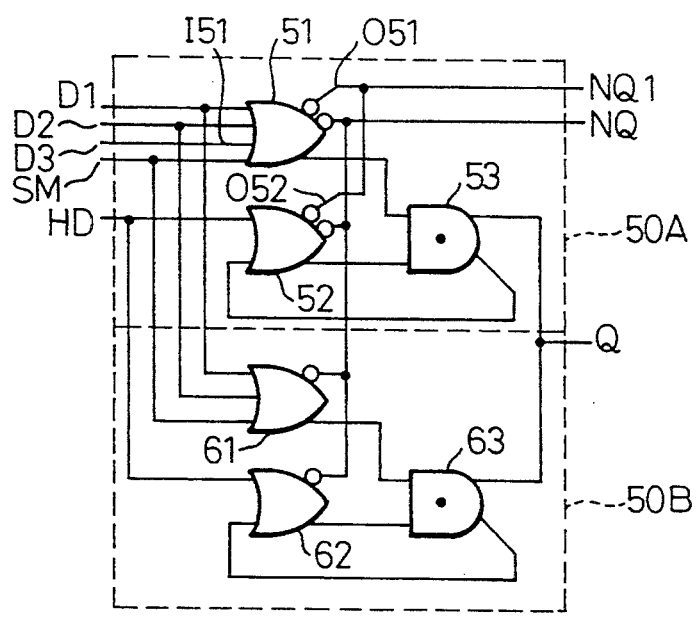
FIG. 11 is a logic circuit diagram a a semiconductor IC device according to a fifth embodiment of the present invention.

FIG. 11 is a logic circuit diagram showing a semiconductor IC device having a dual latch configuration according to a fifth embodiment of the present invention. This embodiment is characterized by separately operating one of latch circuits of the dual latch configuration.

The fifth embodiment of FIG. 11 is a combination of the first and second embodiments of FIGS. 7 and 8.

Namely, an OR/NOR gate 51 of a first latch circuit 50A has an additional input terminal I51 to receive a data signal D3, and the OR/NOR gates 51 and 52 have respective output terminals O51 and O52 connected to provide an output signal NQ1 of inverted level. This arrangement enables the first latch circuit 50A of the dual latch configuration to operate discretely. A clock system for providing a sample signal SM and a hold signal HD is common to the first and second latch circuits 50A and 50B.

Figure 12:
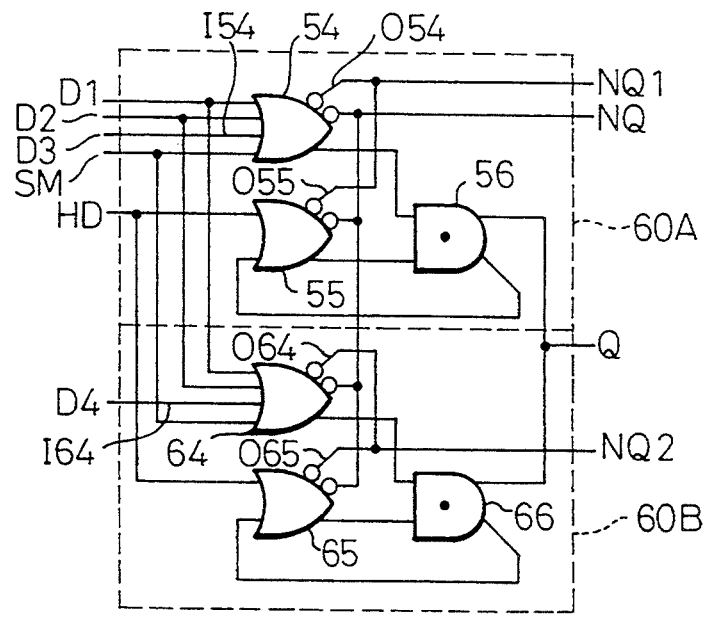
FIG. 12 is a logic circuit diagram a a semiconductor IC device according to a sixth embodiment of the present invention.

FIG. 12 is a logic circuit diagram showing a semiconductor IC device having a dual latch configuration according to a sixth embodiment of the present invention. This embodiment is characterized by separately operating latch circuits of the dual latch configuration.

The embodiment of FIG. 12 is formed by substituting the first latch circuit 50A of the fifth embodiment of FIG. 11 for the second latch circuit 50B thereof.

Namely, an OR/NOR gate 54 of a first latch circuit 60A has an additional input terminal I54 to receive a data signal D3, and the OR/NOR gates 54 and 55 have respective output terminals O54 and O55 connected to provide an output signal NQ1 of inverted level. An OR/NOR gate 64 of a second latch circuit 60B has an additional input terminal I64 to receive a data signal D4, and the OR/NOR gates 64 and 65 have respective output terminals O64 and O65 connected to provide an output signal NQ2 of inverted level. This arrangement enables the first and second latch circuits 60A and 60B of the dual latch configuration to operate independently of each other. A clock system for providing a sample signal SM and a hold signal HD is common to the first and second latch circuits 60A and 60B.

Figure 13:
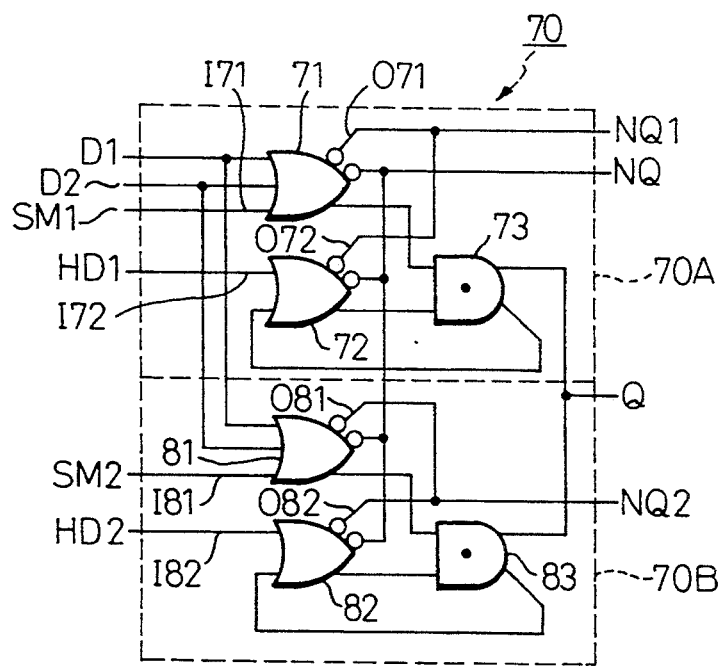
FIG. 13 is a logic circuit diagram a a semiconductor IC device according to a seventh embodiment of the present invention.

FIG. 13 is a logic circuit diagram showing a semiconductor IC device having a dual latch configuration according to a seventh embodiment of the present invention. This embodiment is characterized by controlling latch circuits of the dual latch configuration in response to respective clock signals.

The dual latch configuration 70 of FIG. 13 is based on the prior art of FIG. 3.

In a first latch circuit 70A, an OR/NOR gate 71 has an additional input terminal I71 to receive a first sample signal SM1, and an OR/NOR gate 72 has an input terminal I72 to receive a first hold signal HD1. In a second latch circuit 70B, an OR/NOR gate 81 has an input terminal I81 to receive a second sample signal SM2, and an OR/NOR gate 82 has an input terminal I82 to receive a second hold signal HD2. The OR/NOR gates 71 and 72 of the first latch circuit 70A have respective output terminals O71 and O72 connected to provide an output signal NQ1 of an inverted level. OR/NOR gates 81 and 82 of the second latch circuit 70B have respective output terminals O81 and O82 connected to provide an output signal NQ2 of an inverted level.

In this way, the first and second latch circuits 70A and 70B of the dual latch configuration 70 are operated independently of each other in response to the respective sample signals SM1 and SM2 and hold signals HD1 and HD2.

Figure 14:
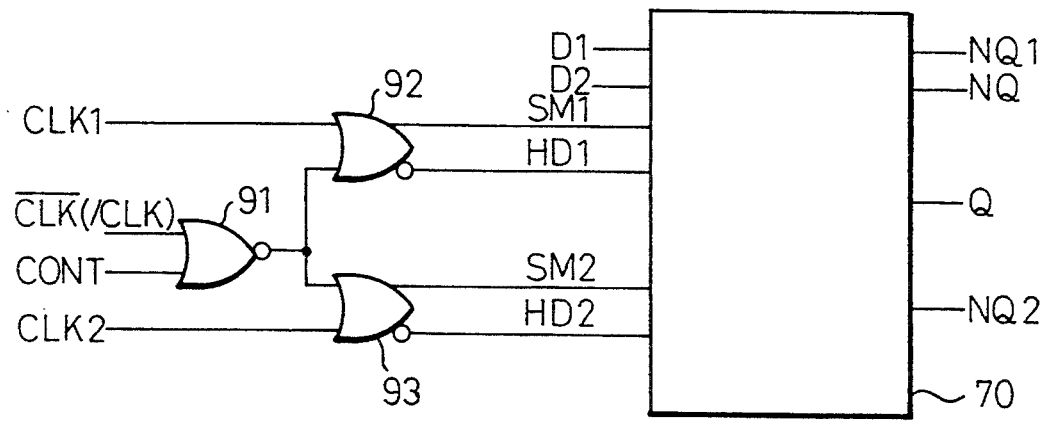
FIG. 14 shows a clock system of the semiconductor IC device of FIG. 13.

FIG. 14 shows a circuit diagram of a clock system of the semiconductor IC device of FIG. 13. The dual latch configuration device 70 of FIG. 13 is provided with OR/NOR gates 92 and 93 and a NOR gate 91.

In FIG. 14, the NOR gate 91 receives a clock signal /CLK of inverted level and a control signal CONT. The OR/NOR gate 92 receives a first clock signal CLK1 and an output of the NOR gate 91. The OR/NOR gate 93 receives a second clock signal CLK2 and the output of the NOR gate 91. The OR/NOR gate 92 provides the OR and NOR outputs thereof as the first sample signal SM1 and first hold signal HD1, respectively, to the dual latch configuration device 70. The OR/NOR gate 93 provides OR and NOR outputs thereof as the second sample signal SM2 and second hold signal HD2, respectively to the dual latch configuration 70.

To carry out a dual latching operation in the arrangement of FIG. 14, the control signal CONT is set to LOW level, the first and second clock signals CLK1 and CLK2 are each set to a LOW level, and the clock signal /CLK is supplied. To carry out a single latching operation in each of the latch circuits 70A and 70B, the control signal CONT is set to HIGH level, and the first and second clock signals CLK1 and CLK2 are supplied. The data signals D1 and D2 are commonly supplied to the first and second latch circuits 70A and 70B of the dual latch configuration 70.

In this way, the embodiment of FIG. 14 operates the dual latch configuration 70 as it is, or selectively operates the two single latch circuits 70A and 70B.

As explained above, each of the fifth to seventh embodiments of FIGS. 11 to 13 provides separate testing I/O terminals (both input and output terminals) for each of the component latch circuits of the corresponding dual latch configuration device thereby to individually operate the latch circuits. Namely, these embodiments selectively form a dual configuration at a required part in a device, thereby suppressing an increase in the number of gates and ensuring the intended effect of the dual configuration device.

Figure 15:
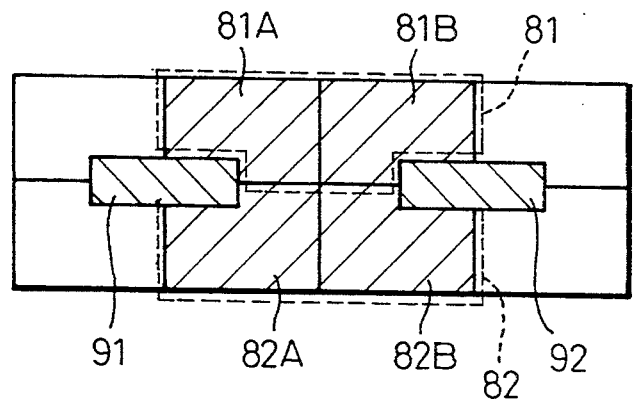
FIG. 15 shows a macro cell of a semiconductor IC device according to the present invention.

FIG. 15 shows a macro cell of a semiconductor IC device according to the present invention. This macro cell occupies a part of the gate array 401 of FIG. 5. In FIG. 15, numerals 91 and 92 are reference voltage generators and 81A, 81B, 82A, and 82B are basic latch circuits each corresponding to the basic cell 403. The latch circuits 81A and 81B form a first dual latch configuration device 81, and the latch circuits 82A and 82B form a second dual latch configuration 82.

In FIG. 15, the macro cell provides the first basic circuit 81A (82A) and the second basic circuit 81B (82B) of the dual latch configuration 81 (82) with reference voltages from the reference voltage generators 91 and 92, respectively. Namely, the first basic circuit 81A (82A) receives an output of the reference voltage generator 91, and the second basic circuit 81B (82B) receives an output of the reference voltage generator 92. The dual latch configuration formed of the latch circuits 81 and 82 provides a correct output unless both of the reference voltage generators 91 and 92 provides an incorrect reference voltage due to alpha rays. Namely, this embodiment employs a dual configuration in the reference voltage generators, too, to prevent soft errors due to alpha rays.

Figure 16:
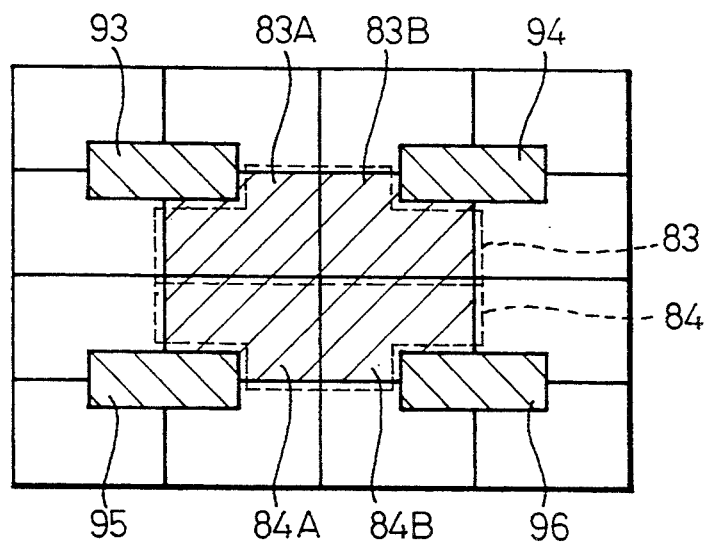
FIG. 16 shows another macro cell of a semiconductor IC device according to the present invention.

FIG. 16 shows a macro cell of a semiconductor IC device according to the present invention. The macro cell occupies a part of the gate array 401 of FIG. 5. In FIG. 16, numerals 93, 94, 95, and 96 are reference voltage generators and 83A, 83B, 84A, and 84B are basic circuits each corresponding to the basic cell 403. The basic circuits 83A and 83B form a latch circuit 83, and the basic circuits 84A and 84B form another latch circuit 84. These latch circuits 83 and 84 form a dual latch configuration.

According to the macro cell of FIG. 16, the first and second basic circuits 83A and 83B of the latch circuit 83 and the first and second basic circuits 84A and 84B of the latch circuit 84 receive reference voltages from the reference voltage generators 93, 94, 95, and 96, respectively. Similar to the macro cell of FIG. 15, the macro cell of FIG. 16 employs a multi-configuration in the reference voltage generators, to prevent soft errors due to alpha rays.

As explained above, each of the macro cells of FIGS. 15 and 16 is formed of two or four basic cells and reference voltages are supplied to latch circuits of a dual configuration from different generators, to thereby ensure the effect of the dual configuration.

In summary, the present invention provides a semiconductor IC device that is capable of individually testing circuits of a dual configuration, to assure the intended effect of the dual configuration. The present invention also provides a semiconductor IC device that is capable of selectively forming a dual configuration at a necessary part in the device, to suppress an increase in the number of gates and assure the intended effect of the dual configuration. The present invention also provides a semiconductor IC device that is capable of supplying circuits of a dual configuration with outputs of different reference voltage generators, to further ensure the effect of the dual configuration. Consequently, the present invention enhances the reliability of a semiconductor IC device through an improved dual configuration.

Many different embodiments of the present invention may be constructed without departing from the spirit and scope of the present invention, and it should be understood that the present invention is not limited to the specific embodiments described in this specification, except as defined in the appended claims.

I claim:

1. A semiconductor integrated circuit device having a dual configuration and comprising:

first and second latch circuits having a common pair of data input terminals and a common pair of data output terminals and connected in parallel between the common pair of data input terminals and the common pair of data output terminals;

the first latch circuit further having a first sample signal input terminal and a first hold signal input terminal respectively receiving a first sample signal and a first hold signal and operating in response thereto, independently of the second latch circuit; and the second latch circuit further having a second sample signal input terminal and a second hold signal input terminal respectively receiving a first sample signal and a first hold signal and operating in response thereto, independently of the first latch circuit.

2. A semiconductor integrated circuit device as recited in claim 1, wherein:

said first latch circuit further comprises a first, independent data output terminal; and said second latch circuit further comprises a second, independent output terminal.

3. A semiconductor integrated circuit device having a dual configuration and comprising:

first and second latch circuits having a common pair of first and second data input terminals, a common sample signal input terminal, a common hold signal input terminal and a common pair of first and second data output terminals;

the first latch circuit further having a third, independent data input terminal;

the second latch circuit further having a fourth, independent data input terminal; and first and second data signals being received at the common pair of the first and second data input terminals, respectively sampling and hold signals being received, respectively, at the common sampling and the common hold signal input terminals and third and fourth data signals being selectively supplied to the third and fourth, independent data input terminals to check the operation, independently, and respectively of the first and second latch circuits.

4. A semiconductor integrated circuit device as recited in claim 3, wherein:

concurrently with the first and second data signals being set to a LOW LEVEL, the third data signal is supplied to the first latch circuit for checking the operation of the first latch circuit.

5. A semiconductor integrated circuit device as recited in claim 3, wherein:

concurrently with the first and second data signals being set to a LOW LEVEL, the fourth data signal is supplied to the fourth data signal input terminal to check the operation of the second latch circuit.

6. A semiconductor integrated circuit device having a dual configuration and comprising:

first and second latch circuits having common first and second data input terminals and common sample and hold signal input terminals and common data output signal terminals;

the first latch circuit further having a third, independent data input terminal;

the second latch circuit further having a fourth, independent data input terminal; and first, second, third and fourth data signals being received at the first, second, third and fourth data input terminals and sampling and hold signals being received at the sampling and hold data input terminals.

7. A semiconductor integrated circuit device as recited in claim 6, wherein:
the first and the second latch circuits, further, have respective first and second output terminals for producing, respectively, first and second inverted level outputs.

* * * * *

UNITED STATES PATENT AND TRADEMARK OFFICE
CERTIFICATE OF CORRECTION

PATENT NO. : 5,436,572
DATED : July 25, 1995
INVENTOR(S) : Eiji SUGIYAMA

It is certified that error appears in the above-indentified patent and that said Letters Patent is hereby corrected as shown below:

Col. 2,     line 47, change "a a" to --of a--;
                line 50, change "a a" to --of a--;
                line 53, change "a a" to --of a--;
                line 56, change "a a" to --of a--;
                line 59, change "a a" to --of a--;
                line 62, change "a a" to --of a--;

Col. 5,     lines 66-67, delete "of a semiconductor IC device".

Col. 6,     line 23, after "configuration", insert --is achieved--.

Signed and Sealed this

Sixth Day of February, 1996

Attest:

BRUCE LEHMAN

Attesting Officer         Commissioner of Patents and Trademarks